United States Patent [19]

Wessely

[11] Patent Number: 5,173,838
[45] Date of Patent: Dec. 22, 1992

[54] ELECTRICAL OPERATIONAL UNIT, PARTICULARLY FOR DATA TECHNOLOGY

[75] Inventor: Hermann Wessely, Munich, Fed. Rep. of Germany

[73] Assignee: Siemens Aktiengesellschaft, Munich, Fed. Rep. of Germany

[21] Appl. No.: 600,444

[22] Filed: Oct. 19, 1990

[30] Foreign Application Priority Data

Oct. 20, 1989 [DE] Fed. Rep. of Germany ....... 3935047

[51] Int. Cl.$^5$ .............................................. H05K 7/20
[52] U.S. Cl. .................................. 361/386; 361/382; 361/385; 361/412
[58] Field of Search ................ 361/381, 382, 385-386, 361/412, 414

[56] References Cited

U.S. PATENT DOCUMENTS

| | | | |
|---|---|---|---|
| 4,514,784 | 4/1985 | Williams | 361/386 |
| 4,922,381 | 5/1990 | Longerich et al. | 361/381 |
| 4,956,746 | 9/1990 | Gates, Jr. et al. | 361/382 |

FOREIGN PATENT DOCUMENTS 0113794 7/1984 European Pat. Off. .

Primary Examiner—Gregory D. Thompson
Attorney, Agent, or Firm—Hill, Van Santen, Steadman & Simpson

[57] ABSTRACT

A packaging system for electrical operational units is composed of several PC boards equipped with components of the so-called flat-pack type, which, on a component side, reside against coolant-permeated cooling plates and are supplied with operating and signal voltages from plugged and/or terminal connections. With the presently-known planar arrangement of such modules in a grid-type frame and with a joint coolant-permeated cooling plate, which lies on the side of the modules, considerable concentrations of components per volume unit could be achieved. The increasing requirements for computers with which an always increasing number of calculating operations is to be performed in the smallest space requires an always increasing concentration of components per volume unit, whereby the problem of heat removal and line supply becomes more acute. In order to achieve an even better concentration of components per volume unit, the present invention provides that, in an alternating sequence, respectively several flat-pack modules and cooling plates are arranged in a surface parallel fashion behind or above one another so that they form a block. The cooling plates are provided with coolant channels and with passageways perpendicularly thereto in which elasticaly-constructed pressure contacts for the wiring of the modules are arranged below one another. On those surfaces of the two outer modules that are not equipped with components, plug plates with recesses are provided for receiving line plugs for the signal supply, whereby on the other two sides of the block, operating voltages are provided and to the third side pair the coolant supply and the coolant discharge for the cooling plates are provided. Therefore, a three-dimensional wiring within the functional unit is enabled.

9 Claims, 5 Drawing Sheets

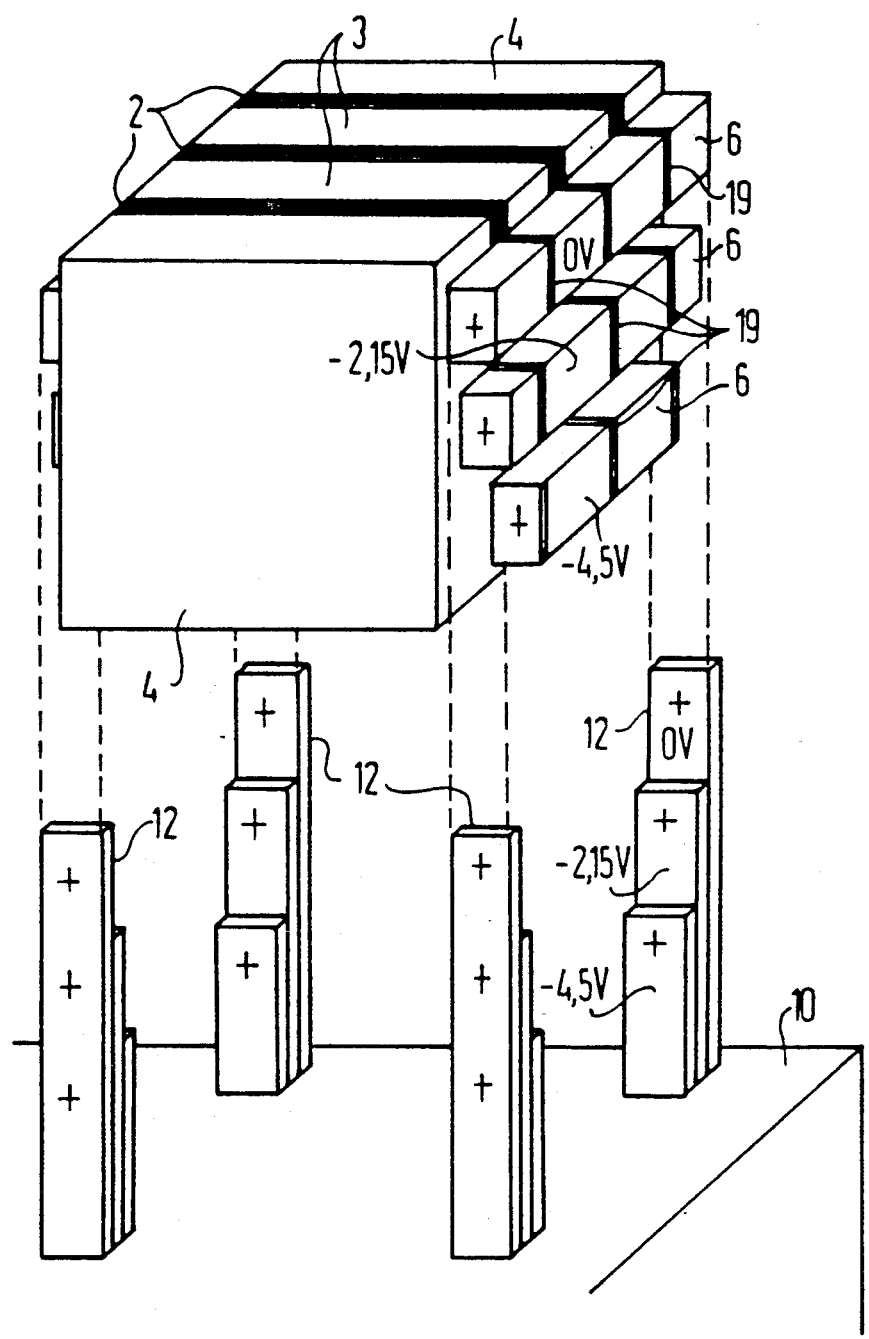

ELECTRICAL OPERATIONAL UNIT, PARTICULARLY FOR DATA TECHNOLOGY

BACKGROUND OF THE INVENTION

1. Field of the Invention

The present invention relates to a packaging system for electrical operational units, particularly for data technology, composed of several printed-circuit (PC) boards equipped with structural components, which on a component side reside next to cooling plates through which coolant flows, and which are supplied from the exterior via plug-in or terminal connections with the operating voltages and signal voltages, whereby the contacting with the PC boards occurs via pressure connectors.

2. Description of the Prior Art

In many areas of electrical technology, as for example in data technology, the requirements for the constructive portion of electronic devices keep getting greater due to the increasing number of logic functions per unit of volume, e.g. in the case of integrated circuits. The feeding of numerous lines in continuously-decreasing spaces and the discharge of the occurring heat are thereby significant factors to be considered.

One structural design which fulfills the high requirements in the above-mentioned sense is already known from the European patent 113 794. In that disclosure, the multi-layer PC boards equipped with components, particularly chips, are arranged side-by-side in one plane in a grid-type frame provided with corresponding recesses, whereby each of these PC boards is allocated its own cooling plate, composed of a good heat-dissipating material, on the component-carrying side of the PC board. In addition thereto, a common further PC board contacting all individual cooling plates and permeated by coolant takes care of the discharge of the heat supplied to the individual cooling plates from the PC boards. The connection of the PC boards with a motherboard attached on the rear side of the grid-type frame is established via pressure plug-connectors, which are located on the rear side of the PC board. Compared to the forerunner systems in which several circuit boards were plugged onto a plate extending perpendicularly thereto, this planar arrangement of circuit boards has lead to a considerable concentration of the space-power ratio, however, and permits a further increase only to a limited extent.

SUMMARY OF THE INVENTION

It is therefore the object of the present invention to provide a packaging system for electrical operational units, particularly for data technology, which enables a further increase of the packing density of large scale integrated (LSI) components.

According to the present invention, the above object is achieved, in that the invention provides a packaging system that is constructed such that, in alternating sequence, respectively, several flat-pack modules equipped with components and cooling plates are arranged in a surface-parallel fashion on top of each other or after one another so that they form a block, in that the cooling plates are provided with coolant channels and with breakthroughs (passageways) extending perpendicularly thereto, in which pressure contacts constructed elastically for the flat-pack modules are arranged below one another, in that against those surfaces of the two outer flat modules not equipped with components, plug plates with recesses for receiving line plugs for the signals applied reside, in that on the two other sides of the block the operating voltages are conducted directly to the potential layers of the flat modules via first conductor strips and in that the coolant supply and the coolant discharge for the cooling plates occur at the third side pair of the block.

With the above measures, a further concentration of components per volume unit and, simultaneously, due to the three-dimensional wiring, a considerable shortening of the connection lengths between the integrated module units is achieved.

Moreover, the coolant is guided in the direct proximity of the heat source and, furthermore, the speed of the coolant is arbitrarily increased, whereby a minimization of the thermal resistance occurs. A minimization of the voltage drop is likewise achieved since the voltage is supplied to the units via massive conductive paths on the shortest distance from the power supply. Due to the utilization of the pressure contact principle, the density of the signal connection per functional unit can be increased considerably. Since the cooling current is insulated from the electrical components, water can be used as a coolant. In providing a sufficiently-large water storage space uniform flow conditions and, thus, uniform heat elimination conditions are obtained.

The conditions that are most favorable for the wiring are obtained when the block is constructed as a die or cube.

The pressure contacts can advantageously be constructed as buckling springs.

Furthermore, it is possible to equip the inner PC boards of the flat-pack module groups with components on both sides of the PC boards.

If the unit is mounted directly on a power supply module, the operating voltages to the conductor paths of the block can be formed in a simple manner via second conductor paths in the form of conductive rails residing perpendicularly thereto and behind one another corresponding to the different potentials, however, graded in length, the second conductor paths being fastened directly at the power supply module.

A thicker epoxy resin layer which serves for the reinforcement of the multilayer PC boards of the flat-pack module group and which is arranged between other thinner layers and is copper clad on both sides (stiffening complex) can thereby likewise be constructed in a multi-layer form and the various layers can be used as potential layers.

A simple connection of the conductor paths with these potential layers results in that the potential layers are provided with over-projecting tabs which are directly connected with the first conductor paths.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 4 is a perspective exploded view schematically illustrating the voltage potential supply for the packaging system;

DESCRIPTION OF THE PREFERRED EMBODIMENTS

Figure 1:
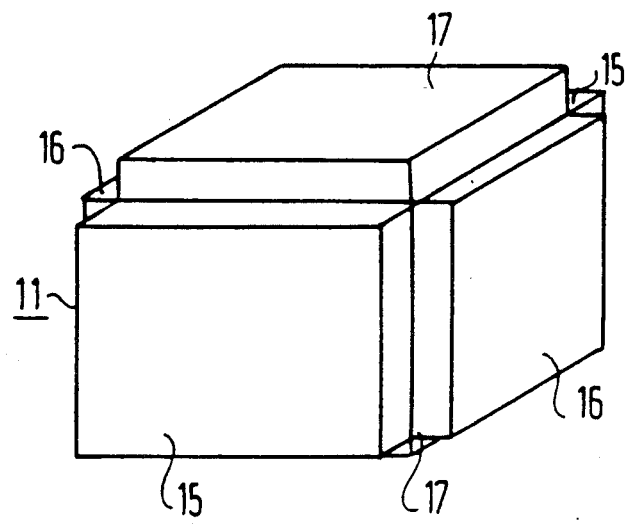
FIG. 1 is a schematic, perspective view of a packaging system constructed in accordance with the present invention.

FIG. 1 illustrates the basic concept of a packaging system according to the present invention. The flat module and cooling plates arranged in alternating sequence above one another constitute a cuboid 11, whereby on the one pair of sides of the cube the cable connection devices 15, 15 are attached, on the second pair of sides the potential feeding devices 16, 16 are attached, and the third side pair of sides, the cooling devices 17, 17 are attached.

Figure 2:
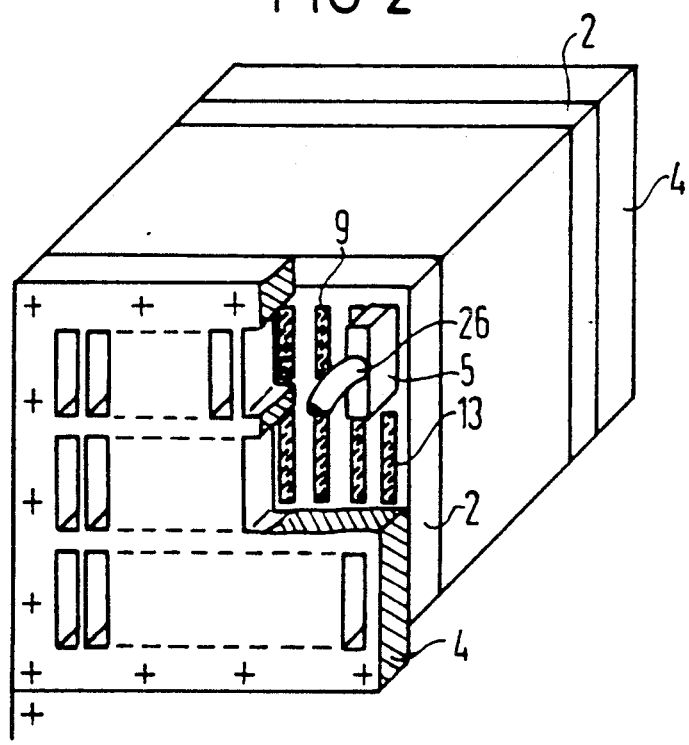
FIG. 2 is a schematic and perspective view of the cable connection for the packaging system.

FIG. 2 illustrates the signal cable connections. Such connections are provided on the front side and the rear side of the cube whereby a plurality of line plugs 5 (only one shown) engage in plug plates 4 which are provided with recesses 13 out of which pressure contacts 9 project. These pressure contacts 9 comprise buckling springs and contact the corresponding contact surfaces when the plug is plugged in on its face end.

Figure 3:
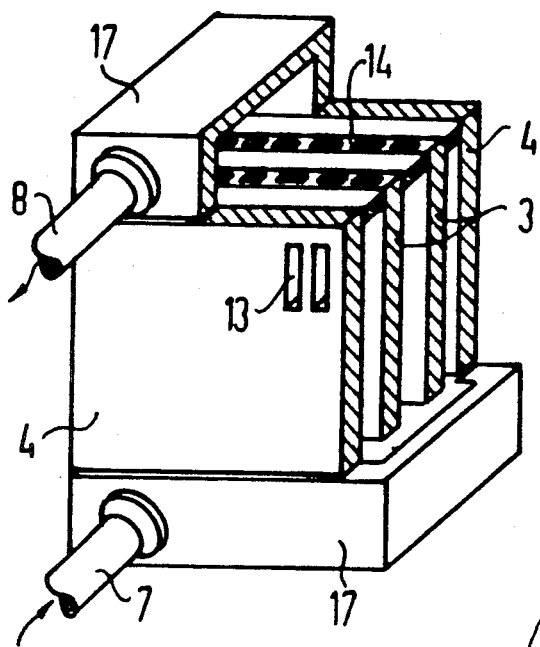
FIG. 3 is a partially sectional schematic perspective view of the cooling devices of the packaging system.

The cooling system for the operational unit is illustrated in FIG. 3. The supply of the coolant occurs at the bottom side via a feed conduit 7 and the device 17 serving as an intake manifold. The coolant flow through coolant channels 14 of the cooling plates 3 which are respectively arranged between the flat modules and leaves the operational unit again at the top side via a coolant discharge conduit 8 from the other device 17 serving as a discharge manifold.

FIG. 4 is a schematic illustration of the construction of an operational unit. From the front to the back one sees the plug plate 4, the flat-pack modules 2 between which the cooling plates 3 are arranged, and at the end, again, another plug plate 4. On the flat-pack modules 2, micro wiring 18 is located. The feeding of the supply voltages occurs laterally via conductor rails 6, whereby in the present case the operating voltages 0 volts, $-2.5$ volt and $-4.5$ volt are to be supplied. The PC boards of the flat-pack modules 2 are constructed in multilayer fashion and contain signal layers and potential layers. The potential layers are guided out of the cube with lateral tabs 19 and firmly connected with the conductor rails 6 at that location. The conductor rail 6 consists of several copper blocks arranged in series successively between which the tabs 19 lie which are screwed together with the blocks. By that construction, a simple feeding of the supply voltages is possible.

The supply voltages are generated by a power supply 10, whereby second conductor rails 12 are attached vertically to extend upwardly from the power supply module 10 and are graded in length corresponding to their voltages. Simultaneously, the horizontal first conductor rails 6 on the unit 11 are likewise graded in length so that those engaged directly to the conductor rails 12 of the power supply module for the potential contacts.

Figure 5:
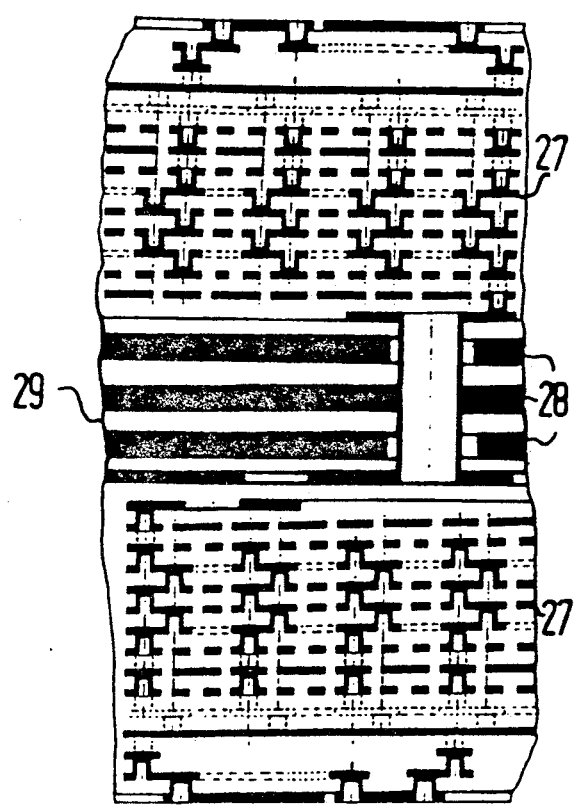
FIG. 5 is a fragmentary sectional view through a multi-layer PC board having a microwiring and reinforcement complex.

FIG. 5 illustrates a multilayer PC board in a fragmentary cross sectional view as it is employed in the flat-pack modules 2. In the center of the multilayer PC board an epoxy resin plate 29 is located which is reinforced compared to the other PC boards and which serves as a reinforcement complex for the multilayer PC board. This epoxy resin layer 29 is likewise a multilayer structure. In the present case it has three layers, whereby the individual layers are fashioned as potential layers 28.

Figure 6:
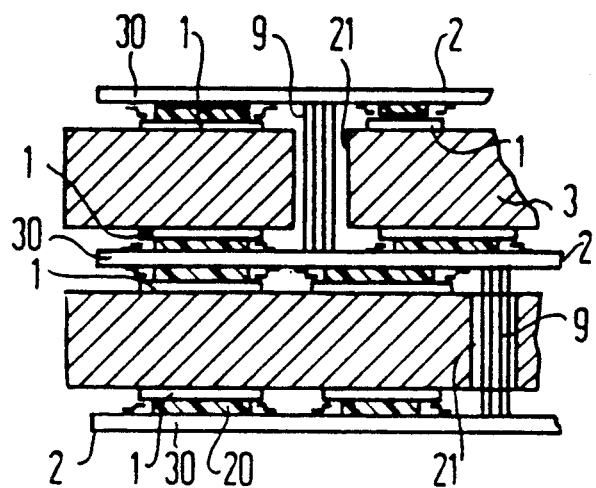
FIG. 6 is a fragmentary sectional view illustrating the electrical connection of three units of the operational unit arranged on top of one another.

FIG. 6 illustrates a portion of a functional unit. Two cooling plates 3 are arranged between three flat-pack modules 2, the cooling plates 3 being provided with breakthroughs (passageways) 21 in which the pressure contacts 9 that are fashioned as buckling springs are located. These pressure contacts 9 establish the connection between the individual flat-pack modules within a functional unit.

The flat-pack modules are composed of a PC board 30 as well as components 1, e.g. chips, which are arranged on one or both sides of the PC boards 30. Between a PC board and a component, respectively, elastically-flexible spacers 20 are inserted through which the component receives a defined pressure against the respective cooling plate, whereby an optimal heat transition from the component 1 to the cooling plate 9 is ensured. The connection of the components 1 on a PC board 30 among each other occurs with the earlier-described microwiring 18 according to FIG. 5 within the individual layers of the multilayer PC board 30.

Figure 7:
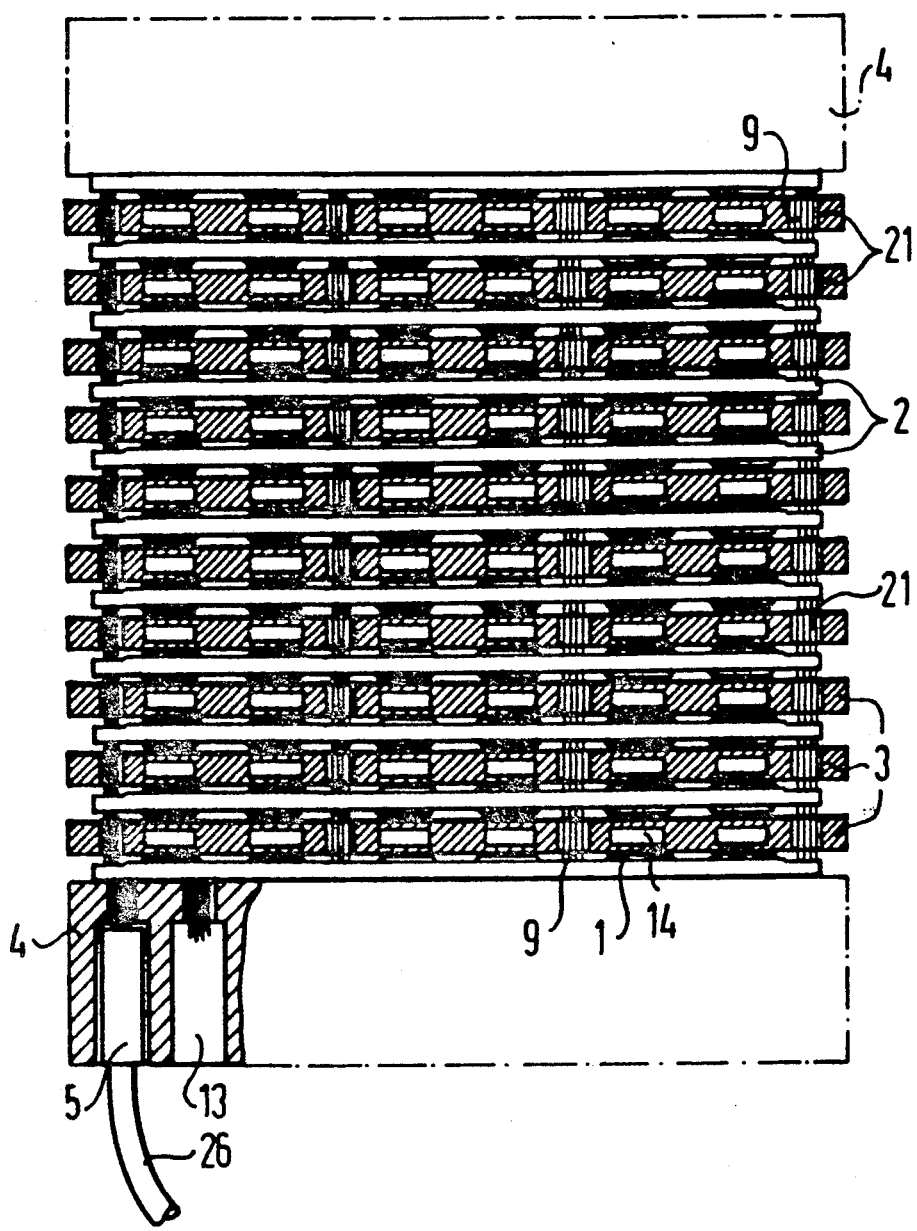
Fig. 7 is a cross sectional view through a larger functional unit of the packaging system.

Whereas in the arrangement according to FIG. 6, only three flat-pack modules 2 are arranged on top of one another, FIG. 7 illustrates an arrangement of eleven flat-pack modules 2 above one another between which respectively, again, cooling plates 3 are provided with corresponding breakthroughs (passageways) 21 in which the pressure contacts 9 are located. On both sides of such a PC board package, likewise plug plates 4 are provided in which the line plugs 5 with the signal lines 26 are located, whereby the line plugs 5 are inserted in the recesses 13 of the plug plates 4. A functional unit of this type can be equipped with maximally 720 LSI circuits. The power dissipation is approximately 40 kW and 50 million gate functions can be managed therewith.

Figure 8:
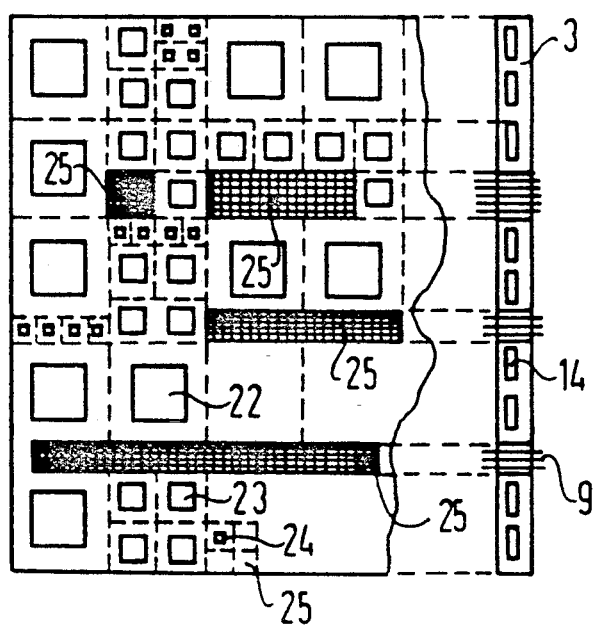
FIG. 8 is a plan view on a flat-pack module equipped with components of different sizes as well as a cross-sectional view through one cooling plate residing on the flat modules.

Besides a uniform equipment of, for example, LSI chips, also a mixed occupation of VLSI circuits 22, LSI circuits 23 and MSI circuits 24 is possible, as shown in FIG. 8 between which, respectively, contact fields 25 are provided. To the right of the PC board portion once again a cooling plate 3 is illustrated in a plan view which, compared to the PC board illustrations is rotated by 90°, and from which it is perceivable how the pressure contacts respectively meet with the appertaining contact fields.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A packaging system comprising:
   a plurality of flat-pack modules including a plurality of printed circuit boards each including voltage supply potential layers and signal conductors and a plurality of flat-pack components mounted on at least one side thereof and electrically connected to the respective voltage supply potential layers and signal conductors;
   a plurality of cooling plates stacked with said plurality of flat-pack modules upon one another to form a block which includes first, second and third pairs of sides;
   each of said cooling plates comprising a plurality of spaced coolant flow channels therein and a plurality of connection passageways extending therethrough between said coolant flow channels;
   a first plurality of resilient pressure contacts extending in groups through said connection passagways to selectively interconnect said signal conductors from board-to-board;
   a plurality of plug plates each mounted on a respective side of said first pair of sides of said block, each of said plug plates including passageways therethrough for receiving respective plug connectors;
   a second plurality of resilient pressure contacts mounted to extend in groups through said passageways to contact the signal conductors of the adjacent printed circuit board and for contacting contact surfaces of the plug connectors;
   a plurality of first conductive rails each for a respective voltage supply potential mounted to extend parallel to one another and across said plurality of printed circuit boards on each side of said second pair of sides of said block, each of said first conductive rails contacting the respective voltage supply potential layers;
   a coolant supply device mounted on one side of said sides of said third pair of sides for receiving a flow of coolant and acting as a manifold in communication with said coolant flow channels; and
   a coolant discharge device mounted on the other side of said third pair of sides in fluid communication with said coolant flow channels for receiving and discharging coolant therefrom.

2. The packaging system of claim 1, wherein: said block is cubic.

3. The packaging system of claim 1, wherein: each of said first and second resilient pressure contacts comprises a buckling spring.

4. The packaging system of claim 1, wherein: said printed circuit boards which are between a respective pair of cooling plates each comprise two component sides.

5. The packaging system of claim 1, and further comprising:
   a power supply module comprising a plurality of second conductive rails each of a graduated length representing a respective predetermined voltage supply potential; and wherein:
   said block rests on said power supply module;
   each of said first conductive rails comprises a graduated length representing a respective predetermined voltage supply potential; and
   said first and second conductive rails extend at right angles with respect to one another such that the respective first and second conductive rails contact when said block is positioned on said power supply module.

6. The packaging system of claim 5, wherein:
   each of said first conductive rails is built up from and comprises a plurality of conductive bars;
   said first conductive rails are disposed side-by-side in a graduated sequence with the longest rail at one end of a sequence and a shortest rail at the other end of the sequence; and
   said second conductive rails are aligned in rows and comprise a pair of spaced rails for each respective predetermined voltage supply potential and with the shortest second conductive rails being the innermost of the respective row and the longest second conductive rails being the outermost of the respective row such that when said block is moved into engagement with said power supply module each first conductive rail extends between and contacts a repective pair of said second conductive rails.

7. The packaging system of claim 1, wherein:
   each of said printed circuit boards comprises a plurality of insulating layers including a thicker epoxy resin layer between a pair of thinner layers and said thicker epoxy resin layer being copper clad on each side thereof to serve as voltage supply potential layers.

8. The packaging system of claim 1, wherein: each of said voltage supply potential layers comprises a projecting tab connected to a first conductive rail.

9. The packaging system of claim 1, and further comprising: a plurality of elastically-flexible spacers each positioned between a flat-pack module and the respective printed circuit board to provide a defined pressure of the respective flat-pack module against the respective adjacent cooling plate.

* * * * *